(12) United States Patent
Shinoda et al.

(10) Patent No.: US 8,112,129 B2
(45) Date of Patent: Feb. 7, 2012

(54) SEAL STRUCTURE, ELECTRONIC APPARATUS, AND SEALING METHOD

(75) Inventors: Takao Shinoda, Kawasaki (JP); Shingo Yamaguchi, Kawasaki (JP); Hidehiko Hizuka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 895 days.

(21) Appl. No.: 12/112,557

(22) Filed: Apr. 30, 2008

(65) Prior Publication Data

US 2009/0020962 A1    Jan. 22, 2009

(30) Foreign Application Priority Data

Jul. 19, 2007  (JP) ................................ 2007-188787

(51) Int. Cl.
*H04M 1/00* (2006.01)
(52) U.S. Cl. ..................... 455/575.1; 277/650
(58) Field of Classification Search .................. 455/575; 439/274, 198; 138/99; 277/379, 398, 572, 277/565, 404, 910, 390; 604/249, 256; 251/4; 440/112; 139/97; 415/112
See application file for complete search history.

(56) References Cited

U.S. PATENT DOCUMENTS

| | | | | |
|---|---|---|---|---|
| 4,681,987 A | * | 7/1987 | Suwa | 200/5 A |
| 5,475,413 A | * | 12/1995 | Hashimoto et al. | 347/108 |
| 7,349,671 B2 | * | 3/2008 | Hirai | 455/73 |
| 7,551,048 B2 | * | 6/2009 | Iwata et al. | 335/78 |
| 2002/0079653 A1 | | 6/2002 | Noguchi et al. | |
| 2003/0211873 A1 | * | 11/2003 | Komiyama | 455/575.3 |
| 2004/0039708 A1 | * | 2/2004 | Zhang et al. | 705/67 |
| 2004/0227673 A1 | * | 11/2004 | Iwai et al. | 343/702 |
| 2006/0160585 A1 | * | 7/2006 | Miyagawa et al. | 455/575.7 |

FOREIGN PATENT DOCUMENTS

| | | |
|---|---|---|
| JP | 3009545 U | 1/1995 |
| JP | 2000-092676 A | 3/2000 |
| JP | 2002-198664 A | 7/2002 |
| JP | 2004-047968 A | 2/2004 |
| JP | 2005-032752 A | 2/2005 |
| JP | 2005-129573 A | 5/2005 |

OTHER PUBLICATIONS

Sugiyama, Connector for Waterproof Flexible Electric Wire Pipe, Mar. 31, 2000, JP Publication No. 2000-092676.*
Korean Office Action dated Nov. 29, 2010, issued in corresponding Korean Patent Application No. 1020080040742.
Japanese Office Action dated Aug. 16, 2011, issued in corresponding Japanese Patent Application No. 2007-188787. (partial translation).
Korean Office Action dated Sep. 29, 2011, issued in corresponding Korean Patent Application No. 10-2008-0040742.

* cited by examiner

*Primary Examiner* — Nick Corsaro
*Assistant Examiner* — Mahendra Patel
(74) *Attorney, Agent, or Firm* — Westerman, Hattori, Daniels & Adrian, LLP

(57) ABSTRACT

A seal structure or a sealing method that seals the housing (case) and allows the signal line to pass through a seal portion of the housing is provided. A recessed level difference is formed on at least one of junction faces of first and second housing units (case units) joined together, and, at a portion including the recessed level difference, a first sealing material (double-faced adhesive sheet), the signal line (flexible cable) or circuit unit, and a second sealing material are held between the first housing unit and the second housing unit. The adhesiveness and flexibility of the first sealing material and the elasticity of the second sealing material allow the signal line or circuit unit to pass through the seal portion while maintaining airtightness.

22 Claims, 17 Drawing Sheets

SEAL STRUCTURE, ELECTRONIC APPARATUS, AND SEALING METHOD

CROSS-REFERENCE TO RELATED APPLICATIONS

This application is based upon and claims the benefit of priority from the prior Japanese Patent Application No. 2007-188787, filed on Jul. 19, 2007, the entire contents of which are incorporated herein by reference.

BACKGROUND OF THE INVENTION

1. Field of the Invention

The present invention relates generally to a seal structure used in various electronic apparatuses, such as a portable device, for water stopping, dustproofing, etc., and more particularly, to a seal structure, an electronic apparatus, and a sealing method that enable the passage of a signal line, such as a flexible cable.

2. Description of the Related Art

An electronic apparatus, such as a portable device, requires a waterproofing function corresponding to the use and function of the electronic apparatus, and is conventionally provided with a sealing structure that prevents the ingress of water, etc.

An electronic apparatus related to such a seal structure that maintains a waterproofing function even when a substrate is held between packings is disclosed in Japanese Patent Application Laid-Open Publication No. 2002-198664. According to this apparatus, a packing in contact with a flexible substrate has a rib-like projection having a uniform height and width, and the projection is fitted in a slot formed on the trunk and back lid of the apparatus. When the apparatus's housing is closed, the projection elastically deforms in a direction in which the projection sticks closely to the side face of the substrate to fill a gap, which suppresses the ingress of water (see ABSTRACT, FIG. 1, etc.).

A waterproof structure built in a portable terminal device having an upper unit and a lower unit that can be folded via a hinge is disclosed in Japanese Patent Application Laid-Open Publication No. 2004-47968. According to the waterproof structure, a space between an FPC and a connection cable, and a case that is outside the FPC and connection cable is filled with a seal packing at the boundary between the hinge and the upper unit and between the hinge and the lower unit (see ABSTRACT, FIG. 1, etc.).

Conventionally, a seal structure in an electronic apparatus, such as a portable device, is provided by such methods as injecting a sealant in a spot to be waterproofed or dustproofed, integrally molding or gluing together a signal line, such as a flexible cable, and a rubber, press fitting a signal line into a case hole, and inserting a packing. The methods of injecting a sealant and of gluing together a flexible substrate and a rubber accompany a demerit that the solidification of the sealant or adhesive takes some time to allow dust to stick to the sealant or adhesive before their solidification, thus requiring a process for controlling the solidification of the sealant or adhesive and preventing dust sticking. This is disadvantageous in terms of a manufacturing process. The method of integrally molding a flexible cable and a rubber accompanies limitations on the type of the rubber to use and the condition of the flexible cable, which leads to a disadvantage of higher manufacturing costs.

The seal structure may be provided as a structure such that a sponge gasket or rubber gasket is simply held between housings. This structure, however, may be incapable of sealing up a gap formed between a flexible cable and the gasket depending on the thickness of the flexible cable and the hardness of the gasket, bringing a concern of incapability in preventing soaking, dust intrusion, etc.

In a structure that a cable is held between a housing and a sealing material, a gap is formed between the cable and the housing when the housing is hard and the cable is thick. If this gap cannot be filled, the structure cannot offer sufficient water stopping and dustproofing functions.

In a structure including two packings that are disposed to sandwich a flexible cable therebetween, a housing incorporating the packings therein is required to have high assembling precision, and a gap may be formed between the cable and the packings when the cable is thicker and the packings are harder. This gap prevents the structure from offering sufficient water stopping and dustproofing functions.

Japanese Patent Application Laid-Open Publication Nos. 2002-198664 and 2004-47968 provide no disclosure and suggestion concerning the above requests and problems, and do not disclose or suggest a configuration, etc., that is solution to the requests and problems.

SUMMARY OF THE INVENTION

An object of the present invention is therefore to improve a sealing function, such as a water stopping and dustproofing function, in sealing a housing that allows a signal line, such as a flexible cable, or a circuit unit to pass through the housing.

Another object of the present invention is to improve workability in a sealing process in sealing a housing that allows a signal line, such as a flexible cable, or a circuit unit to pass through the housing.

To achieve the above objects, the present invention provides a seal structure or a sealing method that seals a housing and that allows a signal line or circuit unit to pass through a seal portion of the housing. According to the structure and method, a recessed level difference is formed on at least one of junction faces of first and second housing units that are joined together, and, at the portion including the recessed level difference, a first sealing material, the signal line or circuit unit, and a second sealing material are held between the first housing unit and the second housing unit, where the adhesiveness and flexibility of the first sealing material and the elasticity of the second sealing material maintain airtightness as the signal line or circuit unit is allowed to pass through. This configuration enables achievement of the above objects.

To achieve the above objects, according to a first aspect of the present invention there is provided a seal structure sealing a housing and allowing a signal line to pass through a seal portion of the housing, comprising a recessed level difference formed on at least one of junction faces of a first housing unit and a second housing unit, a first sealing material disposed to cover the recessed level difference, and a second sealing material covering a signal line placed in a recession of the recessed level difference and being disposed between the first housing unit and the second housing unit.

According to the configuration, the recessed level difference is covered with the first sealing material, and the signal line placed in the recessed level difference is held between the first sealing material and the second sealing material, thus located in the portion including the recessed level difference between the first housing unit and the second housing unit. This allows the signal line to pass through between the first housing unit and the second housing unit, and seals a gap between the first housing unit and the second housing unit, between the first housing unit and the signal line, and between the second housing unit and the signal line. Hence sealing performance between the housing units is improved as the signal line is passed through between the housing units, which offers water stopping and dustproofing effects to achieve the above objects.

To achieve the above objects, in the seal structure, preferably, the first and second sealing materials may be made of a flexible material that cuts off water content or air, the first sealing material may be made of a flexible material having adhesiveness, the first sealing material may have a thickness that exceeds a level difference height of the recessed level difference, the first sealing material may have a width that is larger than a width of the recessed level difference, the first sealing material may contain an expandable/contractible discontinuous foam or a discontinuous foam, the first sealing material may have a thickness that exceeds a thickness of a signal line, the recessed level difference may have a bottom face that is shaped into a flat surface, an irregular surface, or a curved surface, and a side wall that is shaped into a vertical surface, a sloped surface, or a curved surface and the recessed level difference may be formed on both opposed face portions of the junction faces of the first housing unit and the second housing unit. By using any one of such structure, sealing performance between the housing units is improved as the signal line is passed through between the housing units, which offers water stopping and dustproofing effects to achieve the above objects.

To achieve the above objects, according to a second aspect of the present invention there is provided the seal structure in an electronic apparatus. According to such structure, sealing performance between the housing units is improved as the signal line is passed through between the housing units, which offers water stopping and dustproofing effects of the electronic apparatus to achieve the above objects.

To achieve the above objects, in the electronic apparatus, preferably, a circuit unit disposed between the first housing unit and the second housing unit; and a hinge connecting the first housing unit to the second housing unit are comprised.

According to the configuration, the recessed level difference is covered with the first sealing material, and the circuit unit placed in the recessed level difference is held between the first sealing material and the second sealing material, thus located in the portion including the recessed level difference between the first housing unit and the second housing unit. This allows the circuit unit to pass through between the first housing unit and the second housing unit, and seals a gap between the first housing unit and the second housing unit, between the first housing unit and the circuit unit, and between the second housing unit and the circuit unit. Hence sealing performance between the housing units is improved as the circuit unit is passed through between the housing units, which offers water stopping and dustproofing effects to achieve the above objects.

To achieve the above objects, according to a third aspect of the present invention there is provided a sealing method sealing a housing and allowing a signal line to pass through a seal portion of the housing, comprising the steps of; forming a recessed level difference on at least one of junction faces of a first housing unit and a second housing unit, disposing a first sealing material to cover the recessed level difference, and disposing a second sealing material, which covers a signal line placed in a recession of the recessed level difference, between the first housing unit and the second housing unit.

According to such sealing method, the seal structure can be realized between the housing units. Hence sealing performance between the housing units is improved as the signal line is passed through between the housing units, which offers water stopping and dustproofing effects to achieve the above objects.

To achieve the above objects, in the sealing method, preferably, the first and second sealing materials may be made of a flexible material that cuts off water content or air, the first sealing material may be made of a flexible material having adhesiveness, the first sealing material may have a thickness that exceeds a level difference height of the recessed level difference, the first sealing material may have a width that is larger than a width of the recessed level difference, the first sealing material may contain an expandable/contractible discontinuous foam or a discontinuous foam, the first sealing material may have a thickness that exceeds a thickness of a signal line, the recessed level difference may have a bottom face that is shaped into a flat surface, an irregular surface, or a curved surface, and a side wall that is shaped into a vertical surface, a sloped surface, or a curved surface and the step of forming the recessed level difference on both opposed face portions of junction faces of the first housing unit and the second housing unit may be comprised.

Advantages resulting from the above configuration are listed as follows.

(1) The signal line or circuit unit is allowed to pass through the seal portion between the housing units joined together, and sealing performance between the housing units is improved. This offers the waterproofing and dustproofing effects.

(2) Using the recessed level difference formed on at least one of the housing units joined together and the first and second sealing materials enables the passage of the signal line or circuit unit and sealing between the housing units. This simplifies the seal structure.

(3) Use of the above seal structure and sealing method makes unnecessary a highly advanced technique, such as integral molding of the signal line or circuit unit and the sealing material. This enables a reduction in manufacturing and assembling costs.

(4) The signal line or circuit unit is placed in the recessed level difference formed on at least one of the housing units joined together via the first sealing material, and the second sealing material is disposed on the signal line or circuit unit. Because of this, a gap often formed on the edge side of the signal line or circuit unit can be filled with the first and second sealing materials that come into the gap. This improves sealing performance.

(5) If an adhesive material thicker than the signal line or circuit unit is used as the first sealing material, the gap often formed on the edge side of the signal line or circuit unit can be filled with the adhesive material. This improves sealing performance and offers enhanced waterproofing and dustproofing effects.

(6) Use of the above seal structure in an electronic apparatus or portable device improves the sealing performance of the housing of the electronic apparatus or portable device, which provides enhanced waterproofing and dustproofing effects and allows the signal line or circuit unit to pass through the housing to offer better convenience.

(7) Use of the sealing method of the present invention achieves the above sealing structure easily to allow the signal line to pass through the housing units while improving sealing performance, thus improves the water stopping function and dustproofing function of various apparatuses.

Other objects, features, and advantages of the present invention will be understood more clearly by seeing the accompanying drawings and embodiments.

DETAILED DESCRIPTION OF THE PREFERRED EMBODIMENTS

First Embodiment

Figure 1:
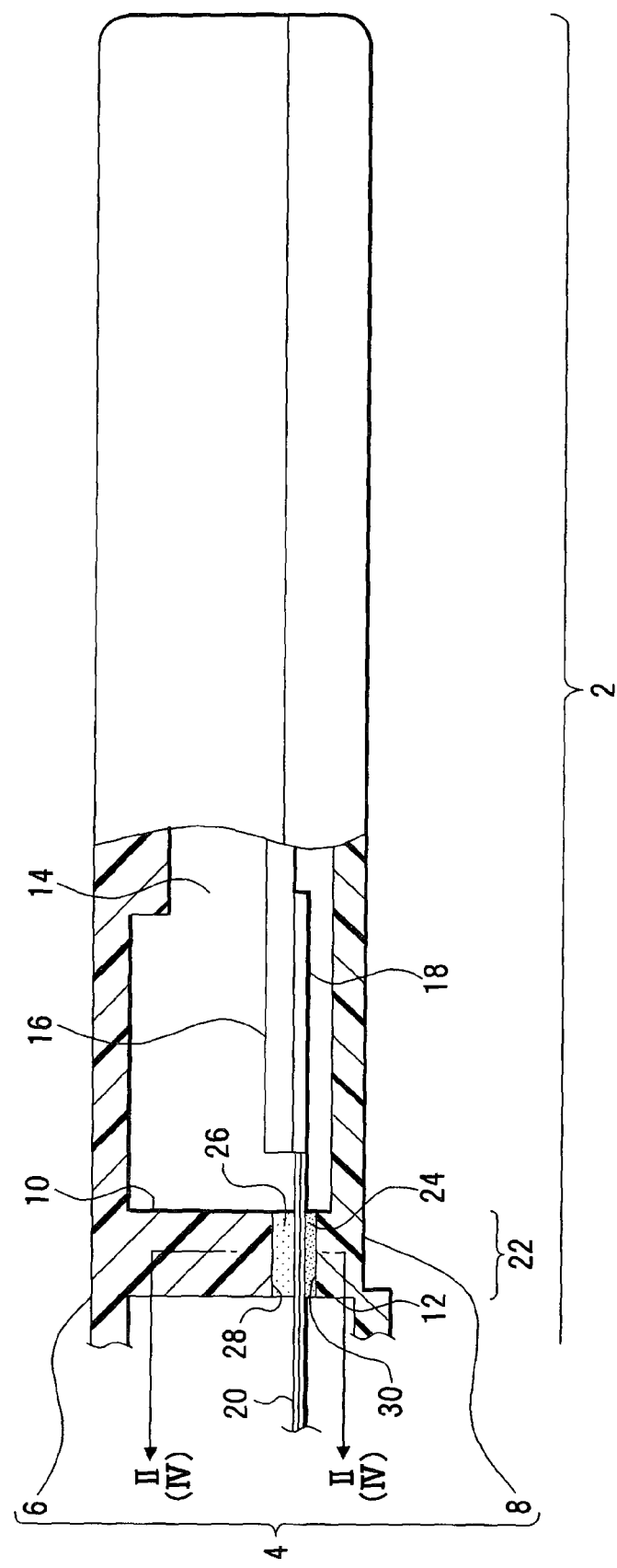
FIG. 1 is a sectional view of a portable device of a first embodiment.
Figure 3:
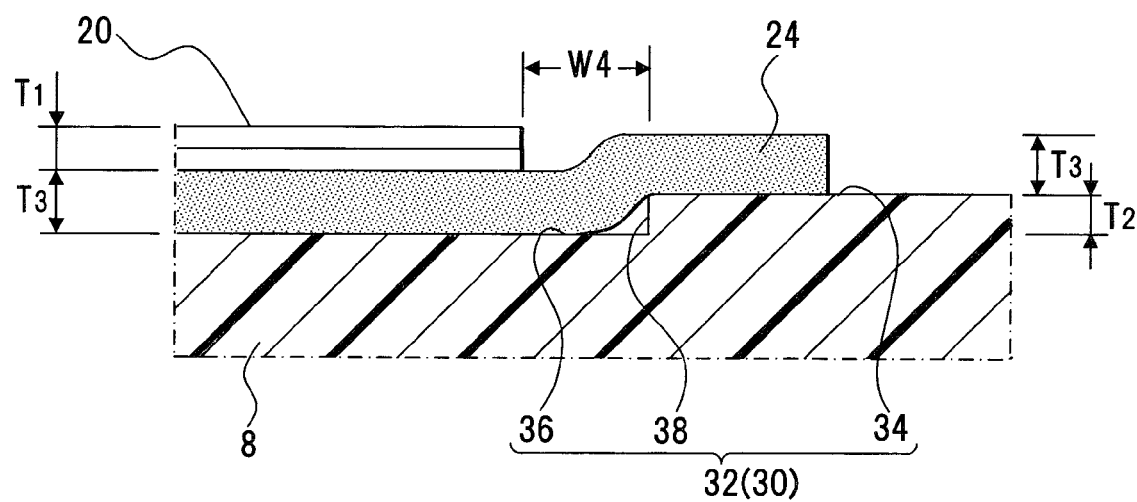
FIG. 3 depicts a double-faced adhesive sheet disposed on a recessed level difference.
Figure 4:
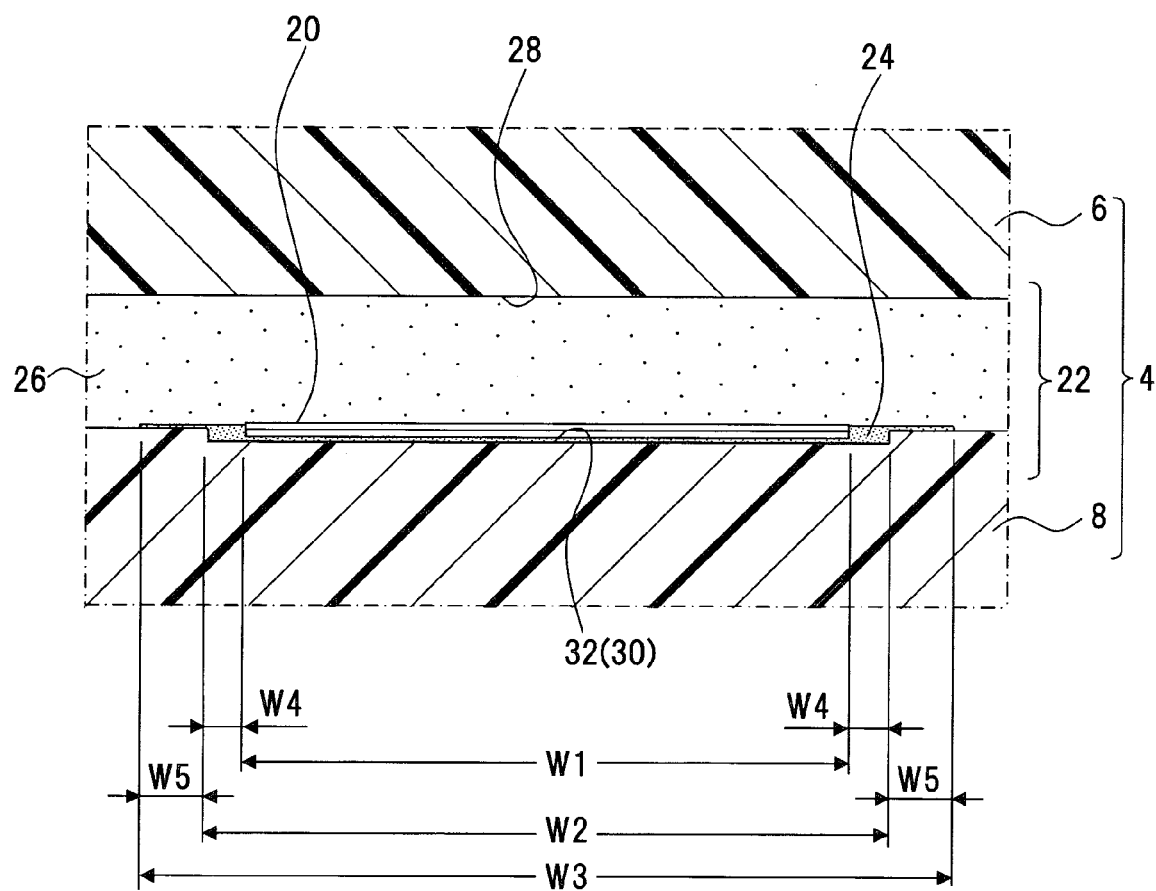
FIG. 4 is a sectional view taken along line IV-IV of FIG. 1 that shows the state of the portable device that has been pressurized.

A first embodiment of the present invention will now be described with reference to FIGS. 1, 2, 3, and 4. FIG. 1 is a sectional view of an example of a portable device of a first embodiment, FIG. 2 is a sectional view taken along line II-II of FIG. 1 that shows the state of the portable device that is not pressurized yet, FIG. 3 depicts a double-faced adhesive sheet disposed on a recessed level difference, and FIG. 4 is a sectional view taken along line IV-IV of FIG. 1 that shows the state of the portable device that has been pressurized.

The portable device 2 is an example of an electronic device or an electronic apparatus to which a seal structure and a sealing method apply. As shown in FIG. 1, a case 4 of the portable device 2 includes case units 6 and 8 that serve as first and second housing (enclosure) units. The case units 6 and 8 are joined together via standing walls 10 and 12 respectively to form a space 14 inside the case units 6 and 8. The space 14 houses various content articles, such as a circuit substrate 16 and an electronic component that serve as a signal line or circuit unit. To a connector 18 of the circuit substrate 16, for example, a flexible cable 20 is connected, which is provided as a platelike cable, signal line, or circuit unit. The flexible cable 20 is lead through a seal portion 22 to come out of the case 4. The platelike cable or signal line includes various circuit wirings, such as signal lines and power lines, and the circuit unit includes circuits, such as an electronic circuit and electric circuit.

On the seal portion 22, a double-faced adhesive sheet 24, which is an adhesive material serving as a first sealing material, and a gasket 26 serving as a second sealing material are disposed across the flexible cable 20. The gasket 26 is located on the side of a junction face 28 of the case unit 6, and the double-faced adhesive sheet 24 is located on the side of a junction face 30 of the case unit 8. The gasket 26 is made of such an elastic material as rubber or elastomer that has elasticity, airtightness to block air inflow, and water stopping property to block water inflow. The double-faced adhesive sheet 24 is made of a discontinuous expandable base material or a base material containing a discontinuous foam. Any material having proper elasticity is applicable as the material of the double-faced adhesive sheet 24.

Figure 2:
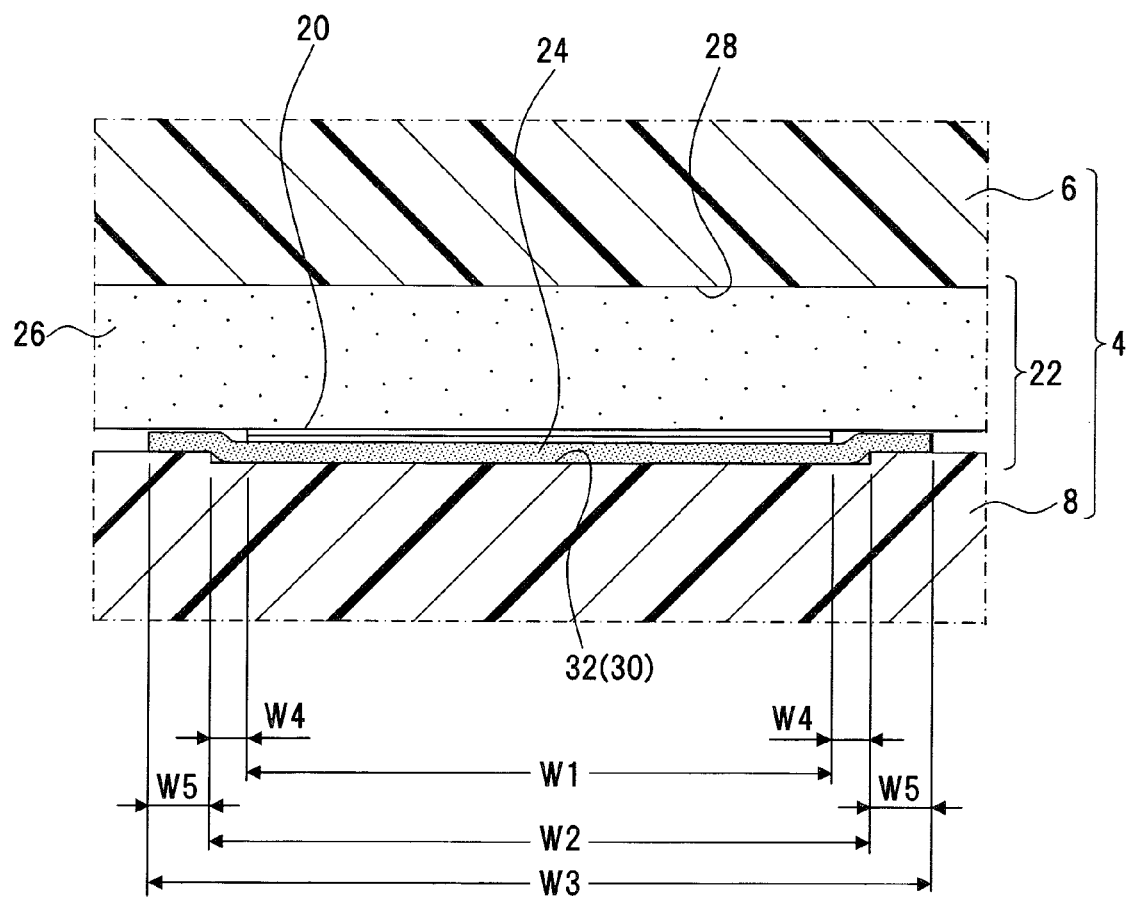
FIG. 2 is a sectional view taken along line II-II of FIG. 1 that shows the state of the portable device that is not pressurized yet.

In the present embodiment, a recessed level difference 32 is formed on the junction face 30 of the case unit 8, as shown in FIG. 2. This recessed level difference 32 is made up of a recession formed on the junction face 30. Here, a size relation is established between the flexible cable 20, the double-faced adhesive sheet 24, and the recessed level difference 32. When the width of the flexible cable 20 is W1, the width of the recessed level difference 32 is W2, and the width of the double-faced adhesive sheet 24 is W3, the width W3 of the double-faced adhesive sheet 24 is determined to be larger than the width W2 of the recessed level difference 32, which width W2 is determined to be larger than the width W1 of the flexible cable 20. In other words, the size relation W1<W2<W3 is established. When the centers of the flexible cable 20, the recessed level difference 32, and the double-faced adhesive sheet 24 are matched up, widths W4 are formed between the flexible cable 20 and the recessed level difference 32, and widths W5 are formed between the recessed level difference 32 and the double-faced adhesive sheet 24. This relation is expressed by the following equations:

$$W3 = W1 + 2(W4 + W5) = W2 + 2 \times W5 \quad (1)$$

$$W2 = W1 + 2 \times W4 \quad (2)$$

This then leads to the equations:

$$W4 = (W2 - W1)/2 > 0 \quad (3)$$

$$W5 = (W3 - W2)/2 > 0 \quad (4)$$

where the width W4 represents a degree of allowance of the recessed level difference 32 to the flexible cable 20, and the W5 represents a degree of largeness of the double-faced adhesive sheet 24 to the recessed level difference 32. If the relation W1<W2<W3 is maintained, therefore, the recessed level difference 32 is covered with the double-faced adhesive sheet 24, and the flexible cable 20 narrower than the recessed level difference 32 is glued to the double-faced adhesive sheet 24. This means that the flexible cable 20 is placed in a dent that is created on the double-faced adhesive sheet 24 by the recessed level difference 32.

The recessed level difference 32, as shown in FIG. 3, is the recession formed on the junction face 30 of the case unit 8, and includes a flat surface portion 34 and recessed surface portion 36, and a vertical surface portion 38 formed between them. The vertical surface portion 38 represents the depth of the recessed level difference 32. In establishing a size relation between the flexible cable 20, the double-faced adhesive sheet 24, and the vertical surface portion 38, when the thickness of the flexible cable 20 is T1, the height (depth) of the vertical surface portion 38 of the recessed level difference 32 is T2, and the thickness of the double-faced adhesive sheet 24 is T3, the thickness T3 of the double-faced adhesive sheet 24 is determined to be larger than the thickness T1 of the flexible cable 20, and to be larger than the height (depth) T2 of the vertical surface portion 38. In other words, the relation T3>T1, T3>T2 is established. In this case, the width W4 is determined to be larger than the height (depth) T2 of the vertical surface portion 38, which gives the relation W4>T2.

In this manner, the double-faced adhesive sheet 24 is glued to the recessed level difference 32 of the case unit 8, and the flexible cable 20 is disposed on the double-faced adhesive sheet 24 to be glued thereto, and the gasket 26 is disposed on the flexible cable 20 to cover the flexible cable 20 and the double-faced adhesive sheet 24 as well. On the gasket 26, the case unit 6 is disposed.

The thickness T3 of the double-faced adhesive sheet 24 is larger than the depth T2 of the recessed level difference 32. Because of this, the recession of the recessed level difference 32 is covered with the double-faced adhesive sheet 24, and the upper face of the flexible cable 20 placed on the double-faced adhesive sheet 24 becomes slightly higher than the upper face of the double-faced adhesive sheet 24 on the flat surface portion 34.

When a compressive force is applied to the case units 6 and 8 so as to reduce the distance between the junction faces 28 and 30 and the compressed state is maintained, the gasket 26 contracts and comes into a gap formed between the gasket 26 and the case unit 8 to provide the seal structure on the seal portion 22 between the case unit 6 and the case unit 8, as shown in FIG. 4. If the flexibility of the gasket 26 is determined to be higher than that of the flexible cable 20 and of the double-faced adhesive sheet 24, the seal structure comes to have higher sealing performance. Such a seal structure prevents the ingress of water, dust, etc., coming from the outside, thus protecting the content articles, such as the circuit board 16, in the space 14 from contamination by water, dust, etc.

Figure 5:
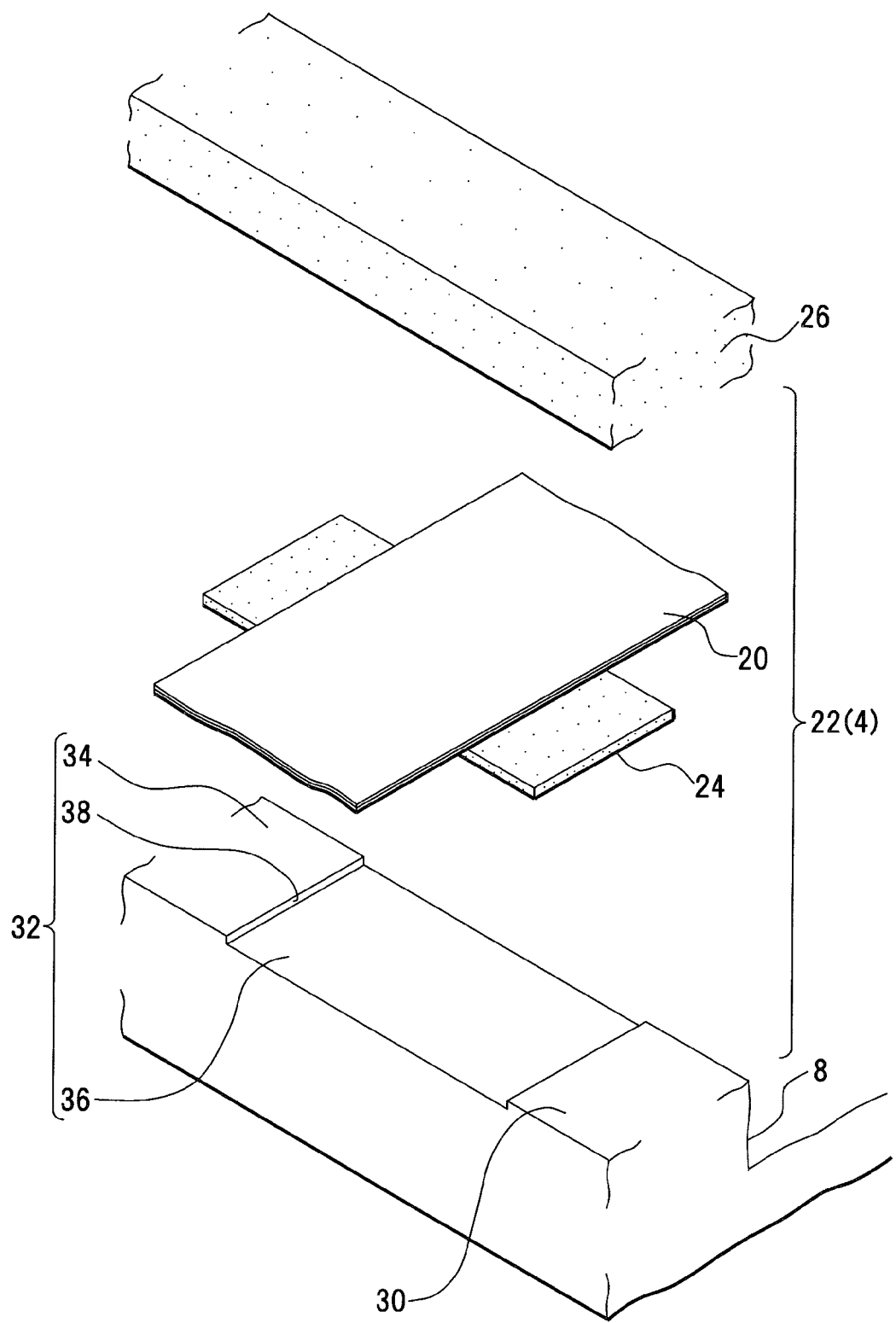
FIG. 5 is an exploded perspective view of a seal portion.

The sealing method will then be described with reference to FIGS. 5 and 6A-6E. FIG. 5 is an exploded perspective view of the seal portion, and FIGS. 6A-6E depict sealing steps as an example of the sealing method. In FIGS. 5 and 6A-6E, the same constituent elements as described in FIGS. 1 to 4 are denoted by the same reference numerals.

This sealing method includes a step of forming the recessed level difference, a step of disposing the adhesive material, and a step of disposing the sealing material.

(A) Step of Forming Recessed Level Difference 32

Figure 6A:
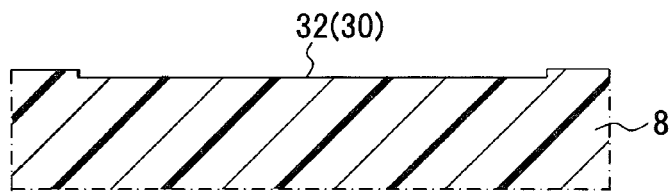
FIGS. 6A-6E depict an example of steps of a sealing method.

The case unit 8 is made by molding a synthetic resin. In the molding process, the recessed level difference 32 is formed on a part of junction face 30 along which the flexible cable 20 is pulled out, as shown in FIGS. 5 and 6A. The height T2 and the width W2 of the recessed level difference 32 have been described above.

(B) Step of Disposing Adhesive Material

Figure 6B:
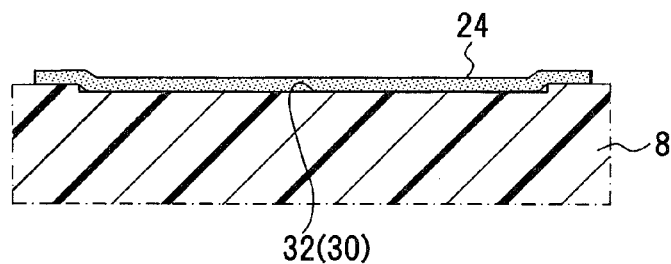

As shown in FIG. 6B, the center of the recessed level difference 32 and that of the double-faced adhesive sheet 24 are matched up, and the double-faced adhesive sheet 24 is disposed on the recessed level difference 32. As a result, the double-faced adhesive sheet 24 covers the recessed level difference 32, and is glued to the junction face 30. A dent corresponding to the recessed level difference 32 is formed on the double-faced adhesive sheet 24 that has been glued to the junction face 30.

(C) Step of Disposing Flexible Cable 20

Figure 6C:
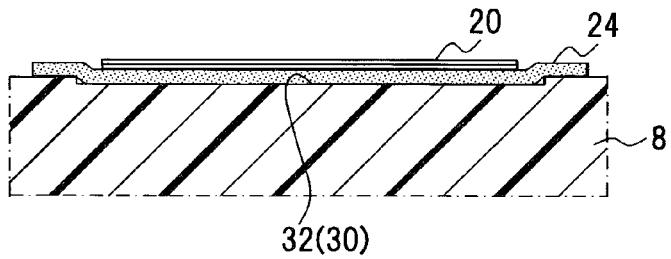

As shown in FIG. 6C, the flexible cable 20 pulled out of the circuit substrate 16 in the space 14 (FIG. 1) is disposed and glued on the upper face of the double-faced adhesive sheet 24. If the center of the flexible cable 20 and that of the recessed level difference 32 are matched up under the size setting as described above, the flexible cable 20 is placed in the dent that is created on the upper face of the double-faced adhesive sheet 24 by the recessed level difference 32. The flexible cable 20 is positioned and fixed on the double-faced-adhesive sheet 24 by its adhesion.

(D) Step of Disposing Sealing Material

Figure 6D:
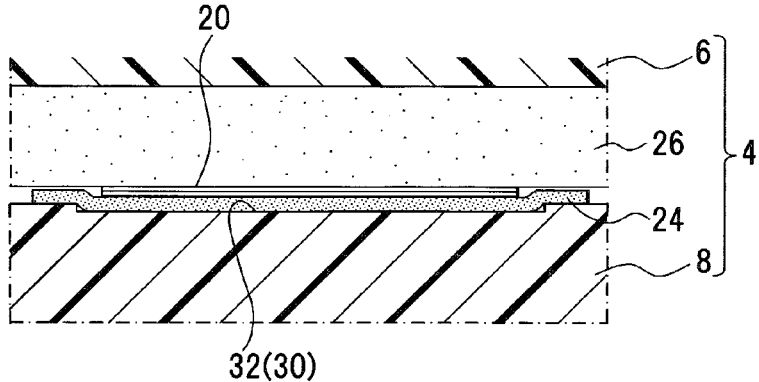

On the upper face side of the flexible cable 20, the gasket 26 and the case unit 6 are disposed to cover the flexible cable 20 and the double-faced adhesive sheet 24, as shown in FIG. 6D.

(E) Assembling Step

Figure 6E:
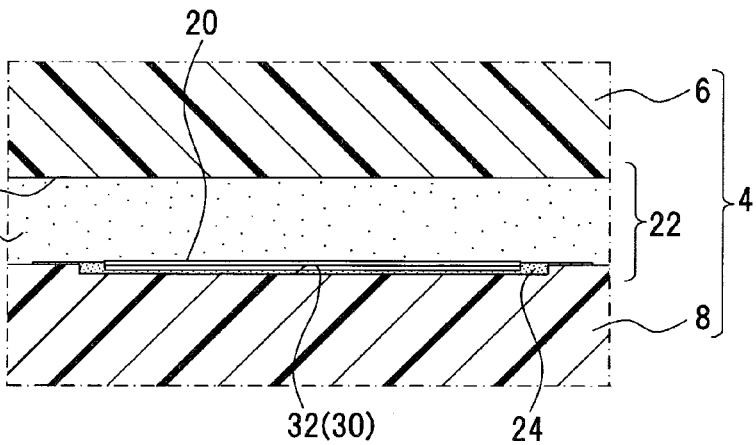

A vertical compressive force is applied to the case units 6 and 8 to put them in a fixed position. As a result, as shown in FIG. 6E, the gasket 26 is compressed, and is caused to seal up a gap formed in the seal portion 22. At the same time, the double-faced adhesive sheet 24 is also deformed by the applied compressive force to come into a gap on the recessed level difference 32. Hence the seal structure with high airtightness is provided, as shown in FIG. 4.

Advantages of the above seal structure and sealing method are listed as follows.

According to the above seal structure and sealing method, the double-faced adhesive sheet 24 is pasted on the case unit 8 having the recessed level difference 32, and the flexible cable 20 and the gasket 26 are disposed on the double-faced adhesive sheet 24, and then the case unit 6 is disposed on the gasket 26 to hold the adhesive sheet 24, flexible cable 20, and gasket 26 between the case unit 6 and the case unit 8. This configuration simplifies manufacturing processes, reduces a manufacturing time, and cuts down manufacturing costs, compared to a case where a conventional sealant is used.

Use of a highly advanced technique, such as integral molding of the flexible cable 20 and the gasket 26, is unnecessary. This enables manufacturing free from manufacturer-based restrictions, and a reduction in manufacturing costs.

Since the flexible cable 20 is sandwiched between the gasket 26 and the double-faced adhesive sheet 24 made of a discontinuous expandable base material that is thicker than the flexible cable 20, a gap formed on the edge of the flexible cable 20 can be filled without fail. This improves sealing performance, and enhances water stopping property and dust-proofness.

Second Embodiment

Figure 7A:
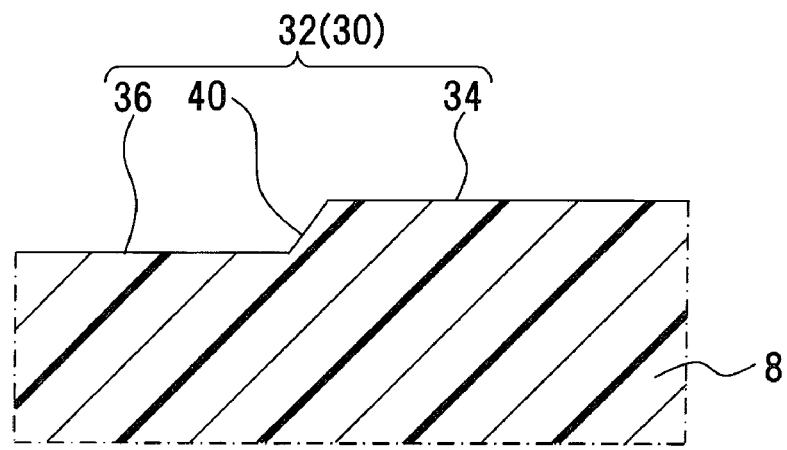
FIGS. 7A and 7B depict a recessed level difference of a second embodiment, consisting of FIG. 7A that depicts the recessed level difference on which the double-faced adhesive sheet is not disposed yet, and FIG. 7B that depicts the recessed level difference on which the double-faced adhesive sheet has been disposed.
Figure 7B:
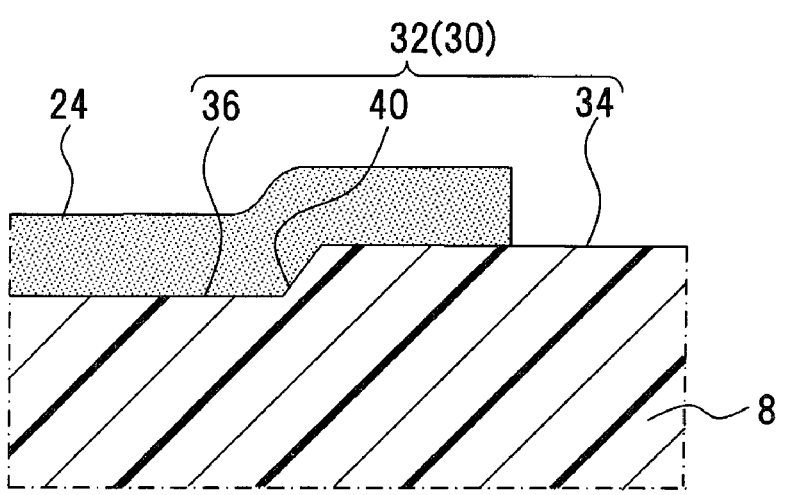

While the recessed level difference 32 is provided with the vertical surface portion 38 (FIG. 3) in the first embodiment, the vertical surface portion 38 may be replaced with a sloped surface portion 40 in adoption of another configuration as shown in FIG. 7A. Using the sloped surface portion 40 allows the double-faced adhesive sheet 24 to be fitted closely to the level difference 32 along the sloped surface portion 40, thus prevents gap formation, as shown in FIG. 7B. In FIGS. 7A and 7B, the same constituent elements as described in FIG. 3 are denoted by the same reference numerals, and are not described further.

Third Embodiment

Figure 8A:
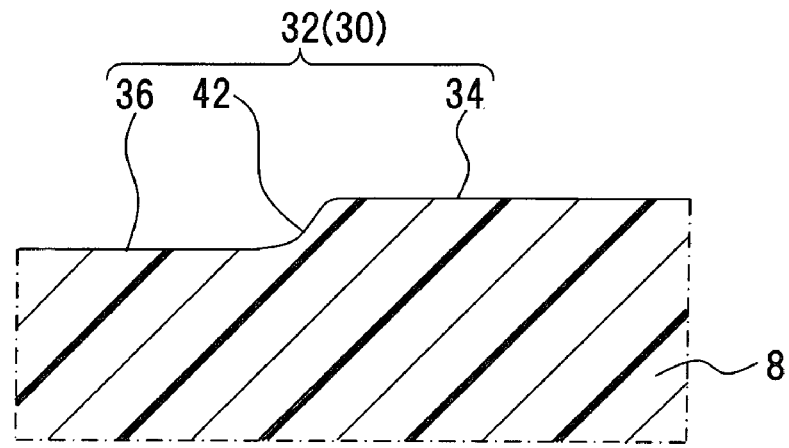
FIGS. 8A and 8B depict a recessed level difference of a third embodiment, consisting of FIG. 8A that depicts the recessed level difference on which the double-faced adhesive sheet is not disposed yet, and FIG. 8B that depicts the recessed level difference on which the double-faced adhesive sheet has been disposed.
Figure 8B:
Figure 8B:
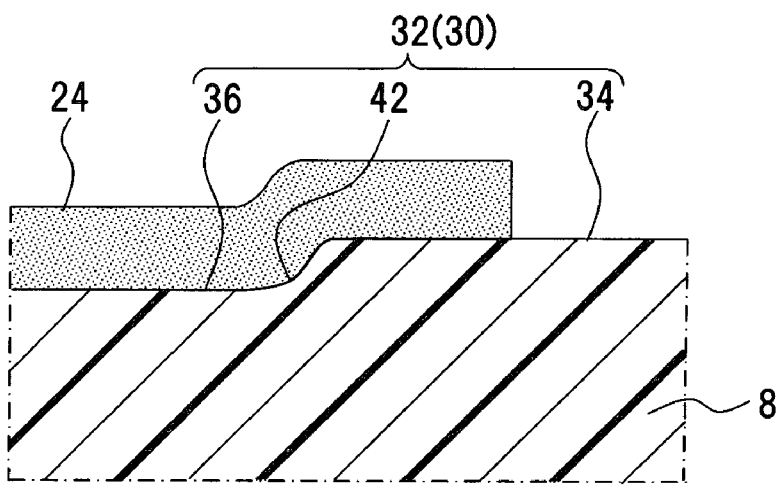

While the recessed level difference 32 is provided with the slopes surface portion 40 (FIGS. 7A and 7B) in the second embodiment, the sloped surface portion 40 may be replaced with a curved surface portion 42 made by rounding angles in adoption of another configuration as shown in FIG. 8A. Using the curved surface portion 42 allows the double-faced adhesive sheet 24 to be fitted closely to the level difference 32 along the curved surface portion 42, thus prevents gap formation, as shown in FIG. 8B. In FIGS. 8A and 8B, the same constituent elements as described in FIG. 3 and FIGS. 7A and 7B are denoted by the same reference numerals, and are not described further.

Fourth Embodiment

Figure 9A:
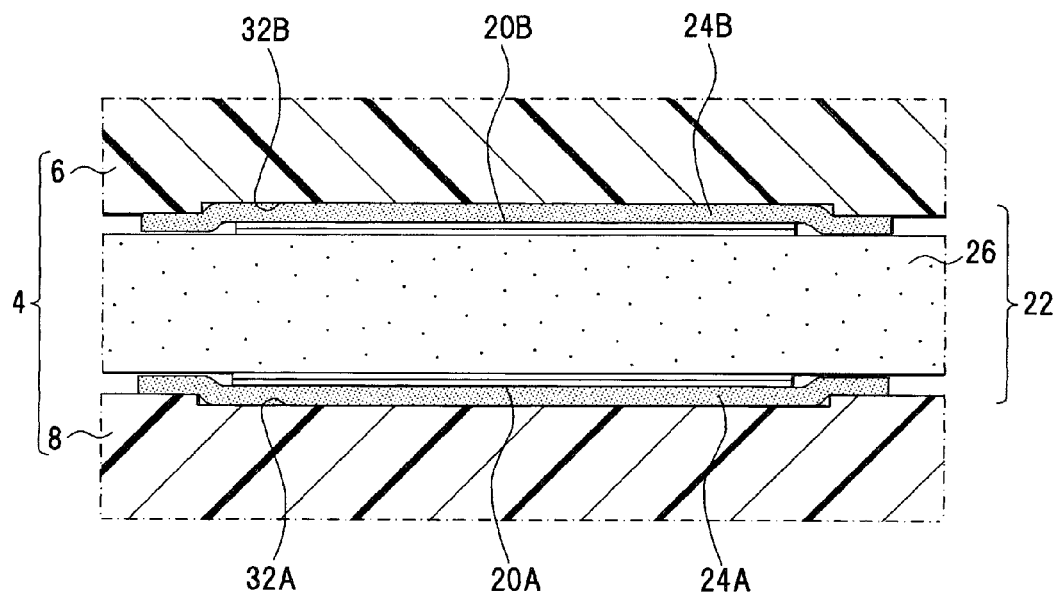
FIGS. 9A and 9B depict a seal portion of a portable device of a forth embodiment.
Figure 9B:
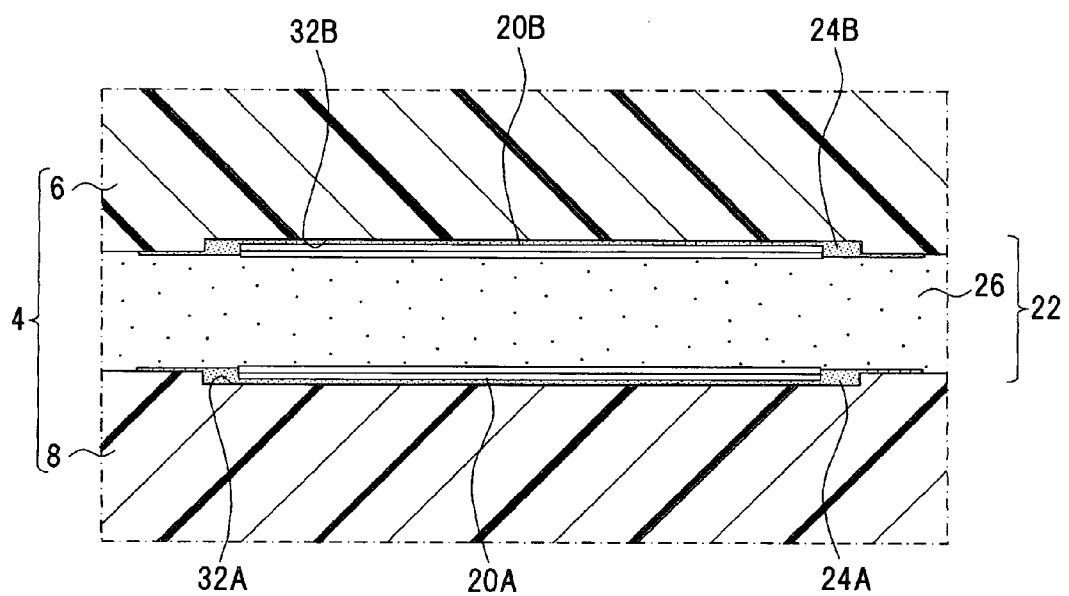

In the first embodiment, the recessed level difference 32 is formed only on the case unit 8 to allow the flexible cable 20 to pass through. Another configuration, however, may be adopted as shown in FIG. 9A, where a recessed level difference 32A is formed on the case unit 8 while a recessed level difference 32B is formed on the case unit 6, double-faced adhesive sheets 24A and 24B, which are the first sealing materials, are disposed on the recessed level differences 32A and 32B, respectively, a flexible cable 20A is disposed on the double-faced adhesive sheet 24A while a flexible cable 20B is disposed on the double-faced adhesive sheet 24B, and the gasket 26, which is the second sealing material, is sandwiched between the flexible cable 20A and the flexible cable 20B. In this case, as shown in FIG. 9B, the case units 6 and 8 are brought into pressure contact closely with the seal portion 22, so that high airtightness is maintained at a portion where the flexible cables 20A and 20B pass through and between the case unit 6 and the case unit 8. According to this configuration, the plurality of flexible cables 20A and 20B are allowed to pass through in the seal structure or by the sealing method of the first embodiment, which offers improved convenience.

Other Embodiments (1) While the double-faced adhesive sheet 24 is provided as the first sealing material in the above embodiments, the double-faced adhesive sheet 24 may be replaced with a flexible sheet having airtightness (air permeability) and not having adhesiveness in adoption of another configuration.

Figure 10:
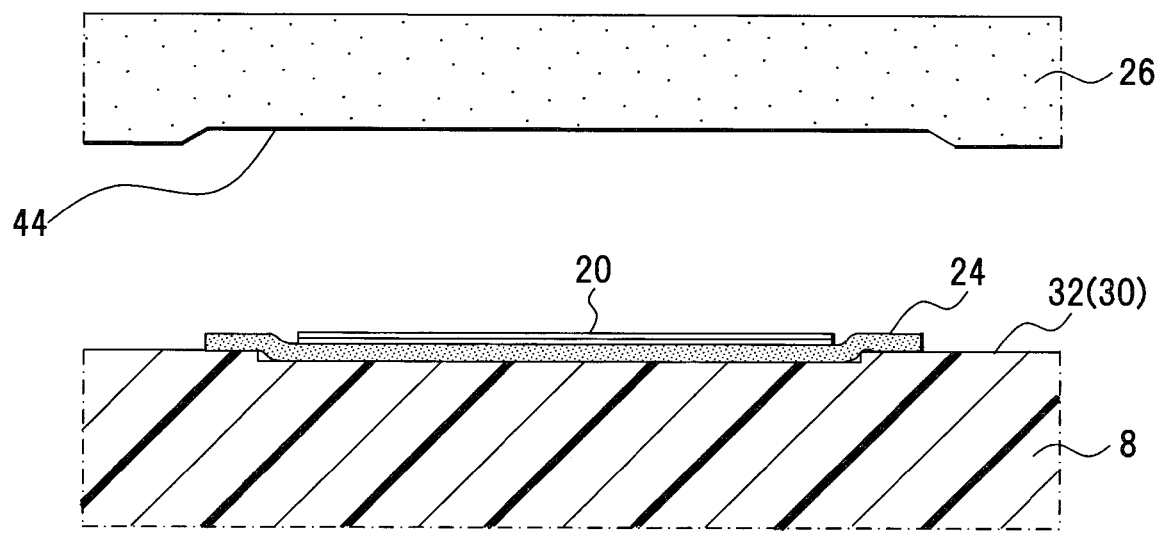
FIG. 10 depicts a seal portion of another embodiment.

(2) While the face of gasket 26 that faces the junction face 30 is shaped into a flat surface in the above embodiments, another configuration may be adopted as shown in FIG. 10, where a recession 44 is formed on the face of gasket 26 that faces the flexible cable 20 and double-faced adhesive sheet 24, and the flexible cable 20 and double-faced adhesive sheet 24 are fitted closely together in the recession 44. In FIG. 10, the same constituent elements as described in FIG. 2 are denoted by the same reference numerals, and are not described further.

Figure 11:
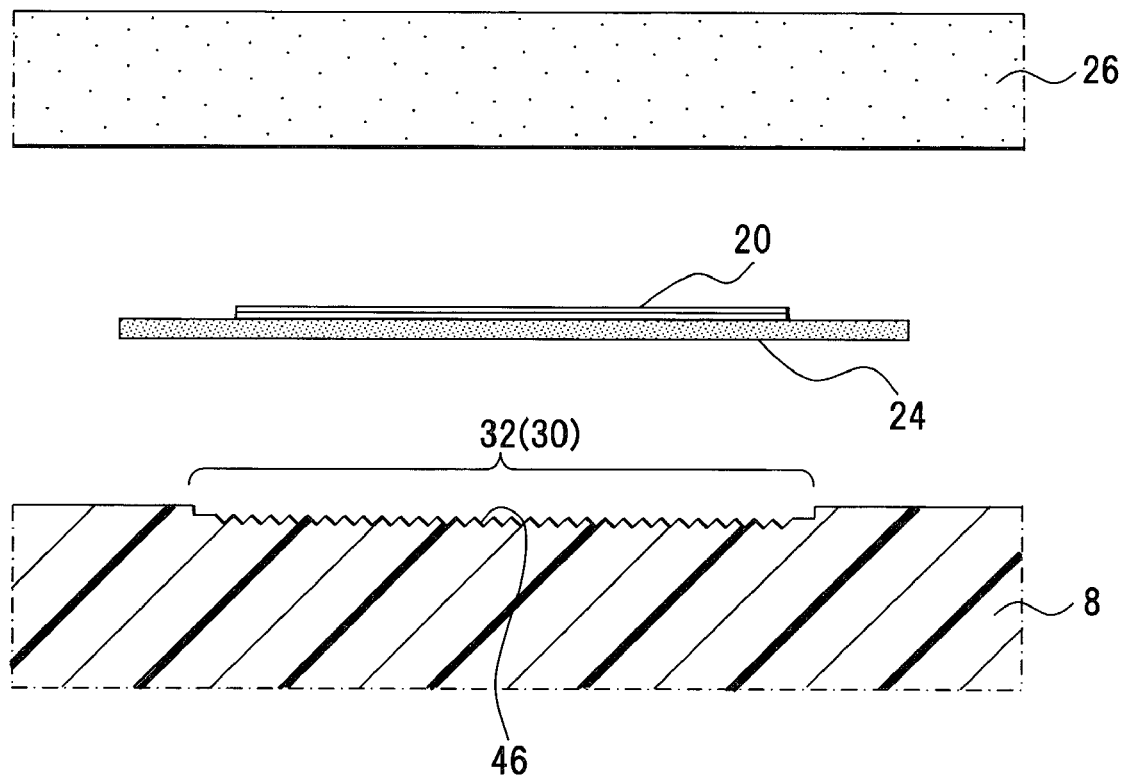
FIG. 11 depicts a seal portion of still another embodiment.

(3) While the recessed surface portion 36 of the recessed level difference 32 is shaped into a flat surface in the above embodiments, the recessed surface portion 36 may be replaced with an irregular surface portion 46 in adoption of another configuration, as shown in FIG. 11. This configuration puts the double-faced adhesive sheet 24 or flexible sheet in a closely fitted state.

(4) While the recessed surface portion 36 of the recessed level difference 32 is shaped into a flat surface in the above embodiments, the recessed surface portion 36 may be shaped into a curved surface in adoption of another configuration. This configuration also puts the double-faced adhesive sheet 24 or flexible sheet in a closely fitted state.

FIRST EXAMPLE

Figure 12:
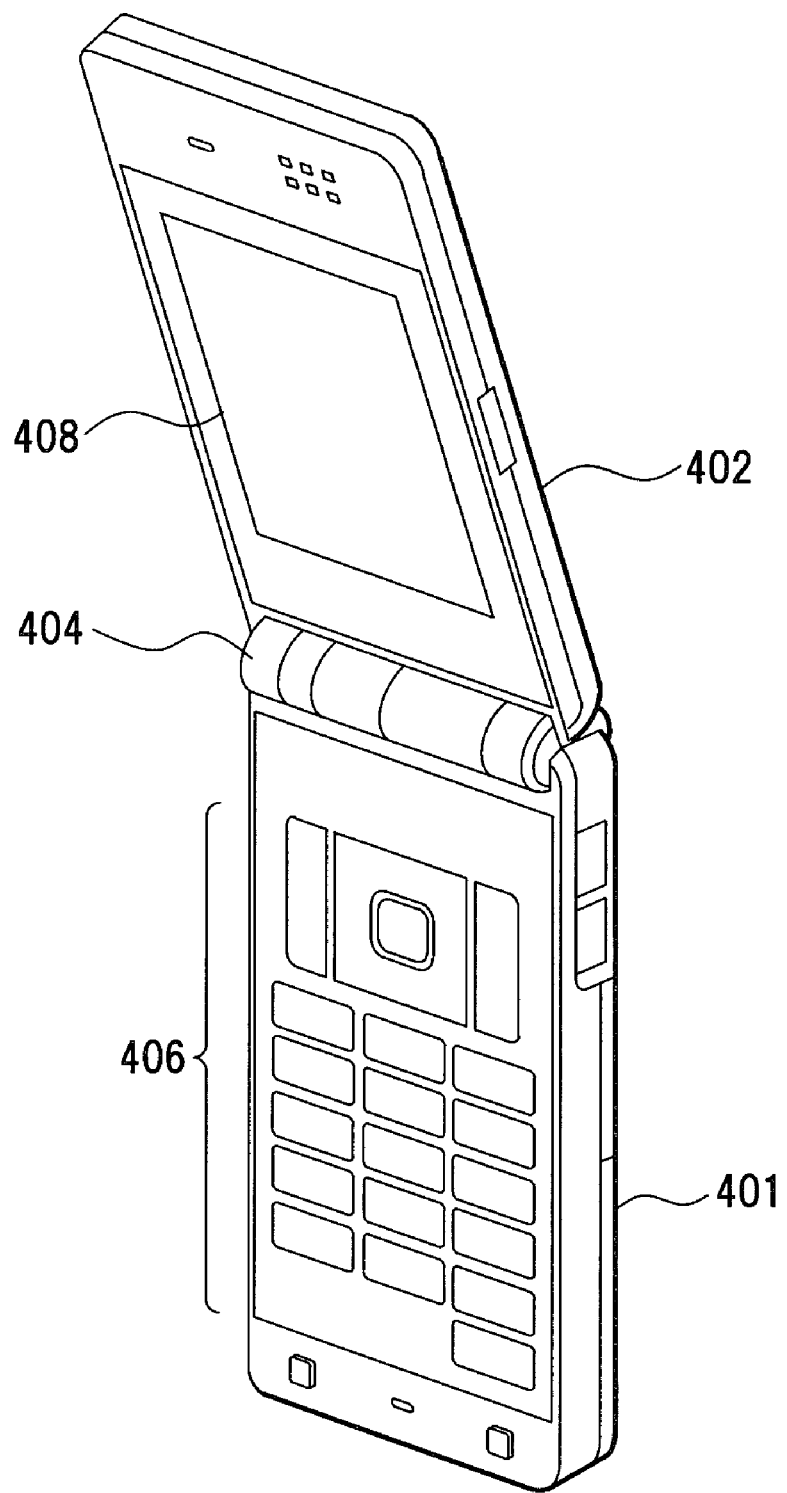
FIG. 12 is a perspective view of a portable device of a first example.
Figure 13:
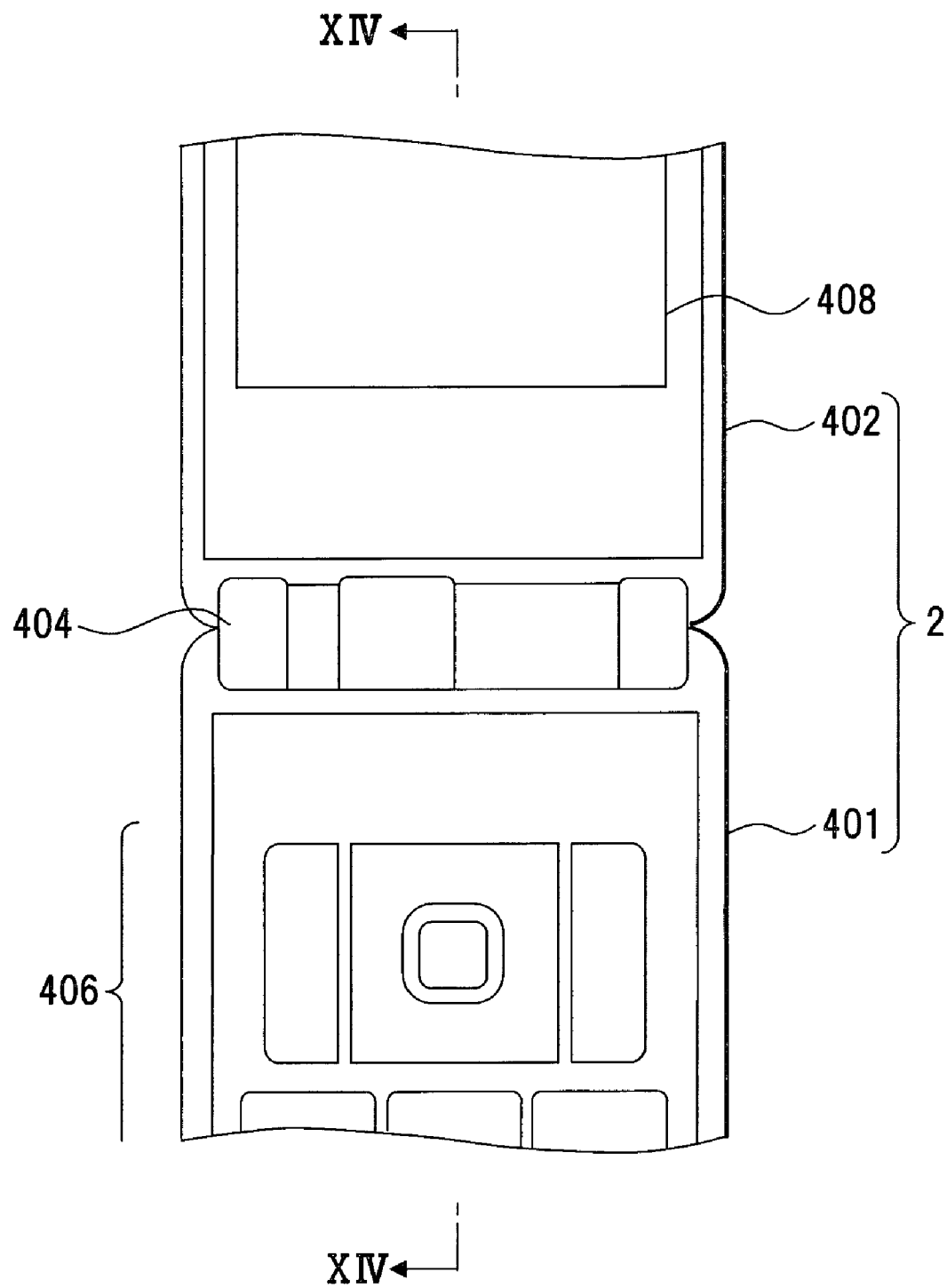
FIG. 13 is an extracted view of a hinge and its vicinity of the portable device.
Figure 14:
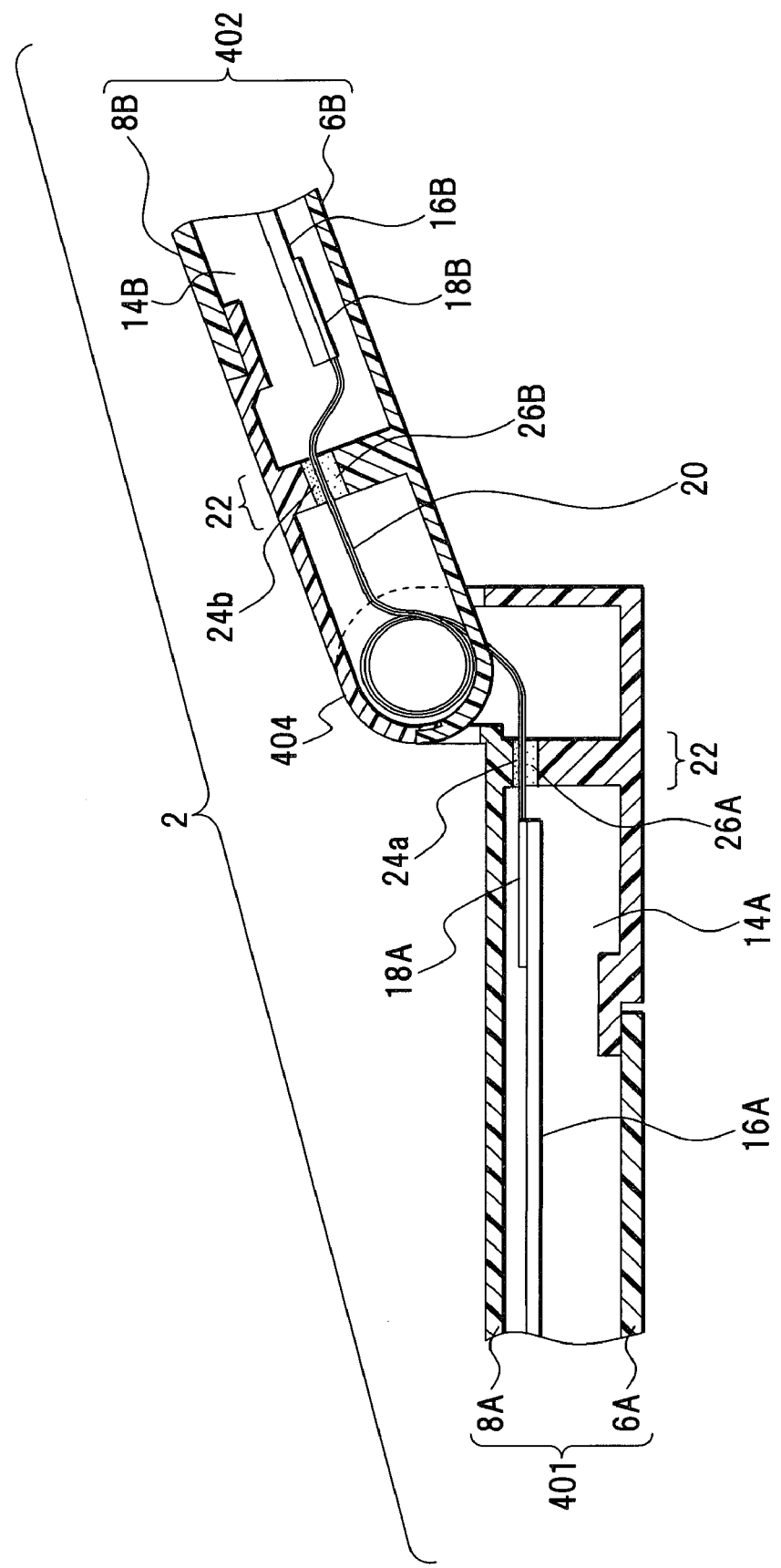
FIG. 14 is a sectional view taken along line XIV-XIV of FIG. 13.
Figure 15:
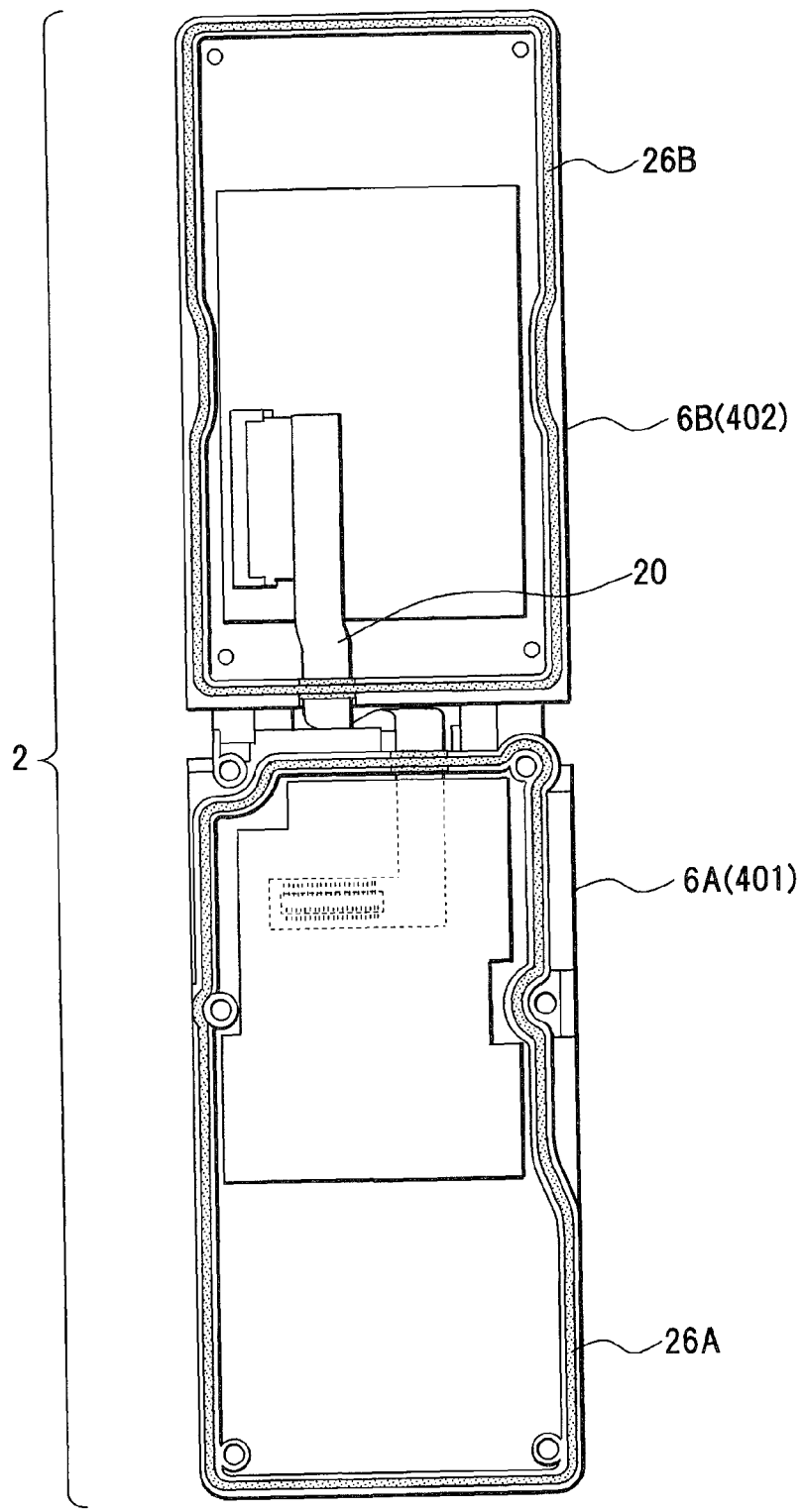
FIG. 15 depicts the arrangement of gaskets of the portable device.

A first example will then be described with reference to FIGS. 12, 13, 14, and 15. FIG. 12 is a perspective view of a portable device of a first example, FIG. 13 is an extracted view of a hinge of the portable device, FIG. 14 is a sectional view taken along line XIV-XIV of FIG. 13, and FIG. 15 depicts the arrangement of gaskets of the portable device. In FIGS. 12 to 15, the same constituent elements as described in FIG. 1 are denoted by the same reference numerals.

As shown in FIGS. 12 and 13, this portable device 2 includes a case 401 as a first housing and a case 402 as a second housing, and the cases 401 and 402 are connected via a hinge 404 and can be folded together. The case 401 has an input operation unit 406 carrying a plurality of keys, and the case 402 has a display unit 408, etc.

As shown in FIG. 14, the case 401 is composed of case units 6A and 8A, and the case 402 is composed of case units 6B and 8B. A circuit substrate 16A placed in a space 14A of the case 401 is connected to a circuit substrate 16B placed in a space 14B of the case 402 via a flexible cable 20, which is lead through the hinge 404.

The above described seal portion 22 is formed on the case 401 and also on the case 402 to seal the spaces 14A and 14B respectively. In this case, the seal portion 22 on the side of the case 401 includes a double-faced adhesive sheet 24$a$ and a gasket 26A while the seal portion 22 on the side of the case 402 includes a double-faced adhesive sheet 24$b$ and a gasket 26B, and both seal portions 22 have the same seal structure as described in the first embodiment (FIGS. 1 to 6E). The seal portions 22 are, therefore, denoted by the same reference numeral and are not described further.

In the portable device 2, as shown in FIG. 15, the gaskets 26A and 26B are disposed in a peripherally encircling manner on the case units 6A and 6B, respectively, where the gaskets 26A and 26B seal the portions other than the seal portions 22.

In this manner, in the portable device 2 having two cases 401 and 402 connected together, the flexible cable 20 is allowed to pass through across the cases 401 and 402, and sealing performance is improved at a portion where the flexible cable 20 passes through by using the seal structure and sealing method according to the example. This prevents the contamination of the interior of the cases 401 and 402 by protecting them from the ingress of such fluid as water, dust, etc., thus offers the portable device 2 with high reliability.

SECOND EXAMPLE

Figure 16:
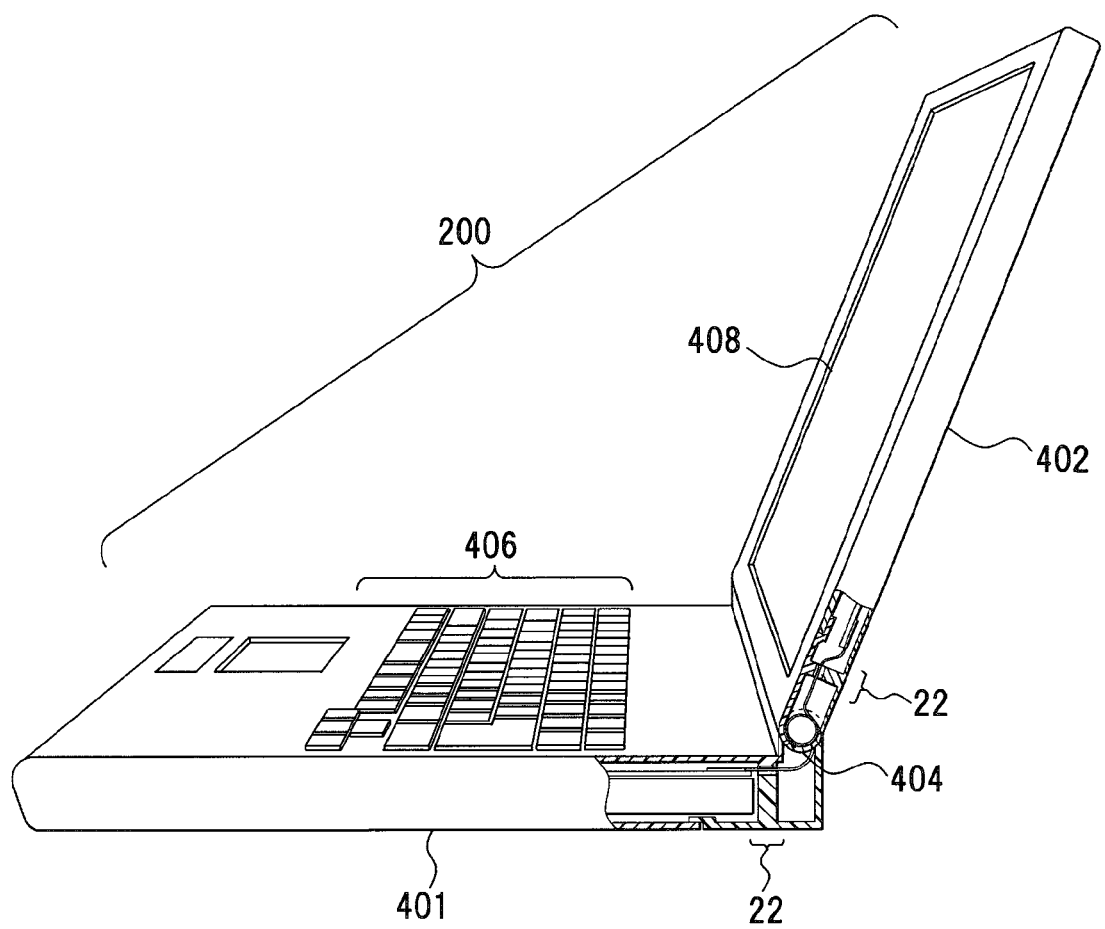
FIG. 16 depicts a personal computer of a second example.

While the portable device 2 is exemplified in the above examples, a present example can apply to another electronic apparatus, for example, to a personal computer (PC) 200, as shown in FIG. 16. This personal computer 200 includes the cases 401 and 402 that are connected via the hinge 404 and that can be folded together. The seal structure and sealing method, therefore, can apply to the personal computer 200 as in the first example. In FIG. 16, the same constituent elements as described in FIG. 14 are denoted by the same reference numbers, and are not described further.

Figure 17:
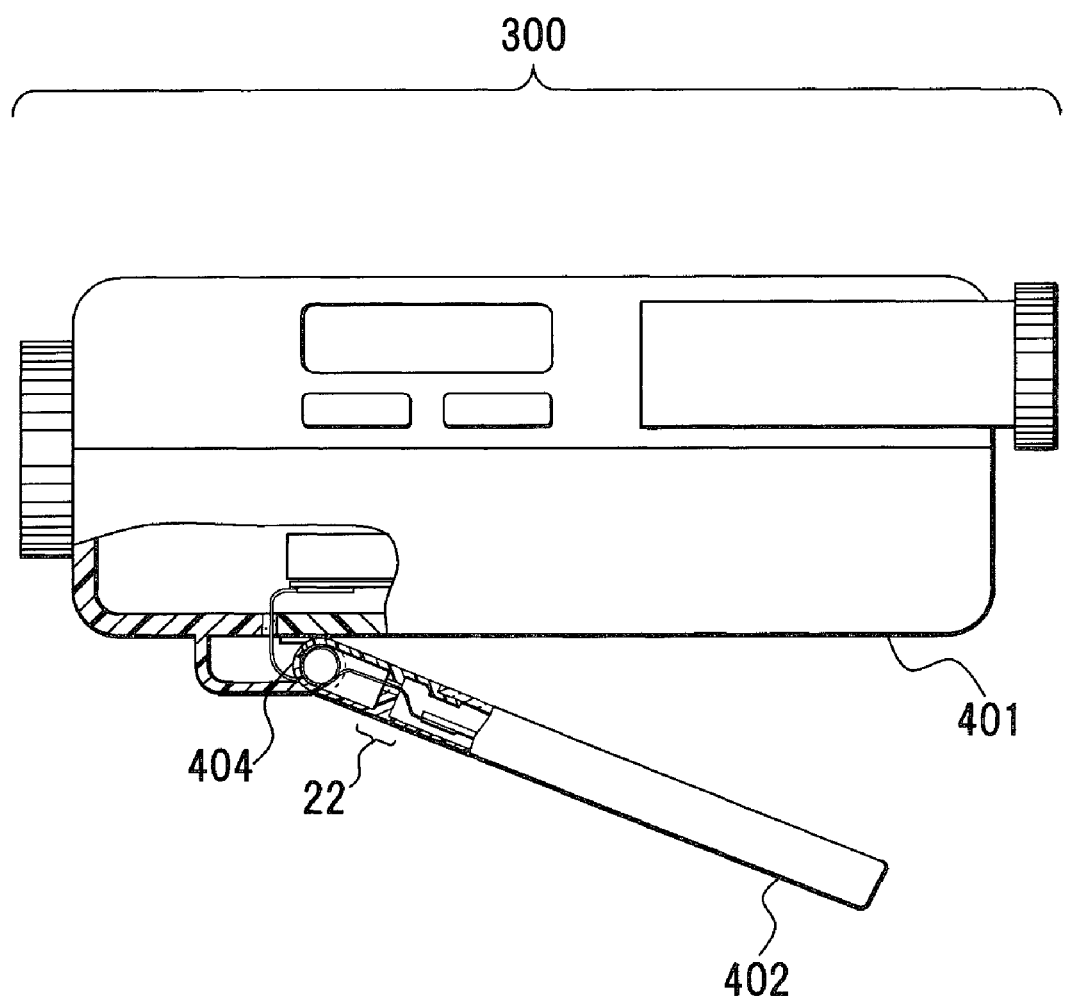
FIG. 17 depicts a video camera of another example.

OTHER EXAMPLES (1) While the portable device 2 and the PC 200 are exemplified in the above examples, the seal structure and sealing method may apply to another electronic apparatus, for example, to a video camera 300 having the hinge 404 that allows the cases 401 and 402 at the display side to open and close against the video body, as shown in FIG. 17. In FIG. 17, the same constituent elements as described in FIG. 14 are denoted by the same reference numbers, and are not described further.

(2) While the electronic apparatus and the portable device each having the hinge to allow opening and closing of the cases are exemplified in the above examples, the present invention may apply to other electronic apparatuses and portable devices not having a hinge, such as a personal digital assistant (PDA), game equipment, and camera. Having a hinge, therefore, is not absolute necessity.

In the above description, the word "housing" is an object to which the content articles are housed and the seal is given, and is not distinguished from "enclosure", "casing", etc.

While the most preferred embodiments of the present invention have been described hereinabove, the present invention is not limited to the above embodiments, and it is a matter of course that various variations and modifications can be made by those skilled in the art within the scope of the claims without departing from the spirit of the invention disclosed herein, and needless to say, such variations and modifications are also encompassed in the scope of the present invention.

The present invention relates to a seal structure used in an electronic apparatus and various electronic devices, such as a portable device, for water stopping, dustproofing, etc. The seal structure is used in various electronic apparatuses, such as a portable device, for water stopping, dustproofing, etc., allowing a signal line to pass through a seal portion between enclosure units joined together while improving sealing performance between the housing units for water stopping and dustproofing. Thus, the present invention advantageously contributes to an improvement in the reliability of an electronic apparatus and portable device.

What is claimed is:

1. A seal structure sealing a housing and allowing a signal line to pass through a seal portion of the housing, comprising:
   a recessed level difference formed on at least one of junction faces of a first housing unit and a second housing unit,
   a first sealing material disposed to cover the recessed level difference, and
   a second sealing material covering a signal line placed in a recession of the recessed level difference and being disposed between the first housing unit and the second housing unit, wherein
   the first sealing material has a width that is larger than a width of the recessed level difference.

2. The seal structure of claim 1, wherein the first and second sealing materials are made of a flexible material that cuts off water content or air.

3. The seal structure of claim 1, wherein the first sealing material is made of a flexible material having adhesiveness.

4. A seal structure sealing a housing and allowing a signal line to pass through a seal portion of the housing, comprising:
   a recessed level difference formed on at least one of junction faces of a first housing unit and a second housing unit;
   a first sealing material disposed to cover the recessed level difference; and
   a second sealing material covering a signal line placed in a recession of the recessed level difference and being disposed between the first housing unit and the second housing unit, wherein
   the first sealing material has a thickness that exceeds a level difference height of the recessed level difference.

5. The seal structure of claim 1, wherein the first sealing material contains an expandable/contractible discontinuous foam or a discontinuous foam.

6. A seal structure sealing a housing and allowing a signal line to pass through a seal portion of the housing, comprising:
   a recessed level difference formed on at least one of junction faces of a first housing unit and a second housing unit;
   a first sealing material disposed to cover the recessed level difference; and
   a second sealing a signal laced in a recession of the recessed level difference and being disposed between the first housing unit and the second housing unit, wherein
   the first sealing material has a thickness that exceeds a thickness of a signal line.

7. The seal structure of claim 1, wherein
   the recessed level difference has a bottom face that is shaped into a flat surface, an irregular surface, or a curved surface, and a side wall that is shaped into a vertical surface, a sloped surface, or a curved surface.

8. A seal structure sealing a housing and allowing a signal line to pass through a seal portion of the housing, comprising:
   a recessed level difference formed on at least one of junction faces of a first housing unit and a second housing unit;
   a first sealing material disposed to cover the recessed level difference; and
   a second sealing material covering a signal line placed in a recession of the recessed level difference and being disposed between the first housing unit and the second housing unit, wherein
   the recessed level difference is formed on both opposed face portions of junction faces of the first housing unit and the second housing unit.

9. An electronic apparatus sealing a housing and allowing a signal line to pass through a seal portion of the housing, comprising:
   a recessed level difference formed on at least one of junction faces of a first housing unit and a second housing unit;
   a first sealing material disposed to cover the recessed level difference; and
   a second sealing material covering a signal line placed in a recession of the recessed level difference and being disposed between the first housing unit and the second housing unit, wherein
   the first sealing material has a width that is larger than a width of the recessed level difference.

10. The electronic apparatus of claim 9, wherein the first and second sealing materials are made of a flexible material that cuts off water content or air.

11. The electronic apparatus of claim 9, wherein the first sealing material is made of a flexible material having adhesiveness.

12. An electronic apparatus sealing a housing and allowing a signal line to pass through a seal portion of the housing, comprising:
   a recessed level difference formed on at least one of junction faces of a first housing unit and a second housing unit;
   a first sealing material disposed to cover the recessed level difference: and
   a second sealing material covering a signal line placed in a recession of the recessed level difference and being disposed between the first housing unit and the second housing unit, wherein
   the first sealing material has a thickness that exceeds a level difference height of the recessed level difference.

13. The electronic apparatus of claim 9, wherein the first sealing material contains an expandable/contractible discontinuous foam or a discontinuous foam.

14. An electronic apparatus sealing a housing and allowing signal line to pass through a seal portion of the housing comprising:
- a recessed level difference formed on at least one of junction faces of a first housing unit and a second housing unit;
- a first sealing material disposed to cover the recessed level difference; and
- a second sealing material covering a signal line placed in a recession of the recessed level difference and being disposed between the first housing unit and the second housing unit, wherein
- the first sealing material has a thickness that exceeds a thickness of a signal line.

15. The electronic apparatus of claim 9, wherein
- the recessed level difference has a bottom face that is shaped into a flat surface, an irregular surface, or a curved surface, and a side wall that is shaped into a vertical surface, a sloped surface, or a curved surface.

16. An electronic apparatus sealing a housing and allowing a signal line to pass through a seal portion of the housing, comprising:
- a recessed level difference formed on at least one of junction faces of a first housing unit and a second housing unit;
- a first sealing material disposed to cover the recessed level difference; and
- a second sealing material covering a signal line placed in a recession of the recessed level difference and being disposed between the first housing unit and the second housing unit, wherein
- the recessed level difference is formed on both opposed face portions of junction faces of the first housing unit and the second housing unit.

17. The electronic apparatus of claim 9, further comprising:
- a circuit unit disposed between the first housing unit and the second housing unit; and
- a hinge connecting the first housing unit to the second housing unit.

18. A sealing method sealing a housing and allowing a signal line to pass through a seal portion of the housing, comprising:
- forming a recessed level difference on at least one of junction faces of a first housing unit and a second housing unit;
- disposing a first sealing material to cover the recessed level difference; and
- disposing a second sealing material, which covers a signal line placed in a recession of the recessed level difference, between the first housing unit and the second housing unit, wherein
- the first sealing material has a width that is larger than a width of the recessed level difference.

19. The sealing method of claim 18, wherein the first and second sealing materials are made of a flexible material that cuts off water content or air.

20. The sealing method of claim 18, wherein the first sealing material is made of a flexible material having adhesiveness.

21. A sealing method sealing a housing and allowing a signal line to pass through a seal portion of the housing, comprising:
- forming a recessed level difference on at least one of junction faces of a first housing unit and a second housing unit,
- disposing a first sealing material to cover the recessed level difference; and
- disposing a second sealing material, which covers a signal line placed in a recession of the recessed level difference, between the first housing unit and the second housing unit, wherein
- the first sealing material has a thickness that exceeds a level difference height of the recessed level difference.

22. The sealing method of claim 18, wherein the first sealing material contains an expandable/contractible discontinuous foam or a discontinuous foam.

* * * * *